United States Patent
Hoekstra et al.

(10) Patent No.: US 9,584,903 B2
(45) Date of Patent: Feb. 28, 2017

(54) MEMS DEVICE AND PROCESS

(71) Applicant: WOLFSON MICROELECTRONICS PLC, Edinburgh, Scotland (GB)

(72) Inventors: Tsjerk Hoekstra, Balerno (GB); Mark Hesketh, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 14/430,466

(22) PCT Filed: Sep. 19, 2013

(86) PCT No.: PCT/GB2013/052460
§ 371 (c)(1),
(2) Date: Mar. 23, 2015

(87) PCT Pub. No.: WO2014/045042
PCT Pub. Date: Mar. 27, 2014

(65) Prior Publication Data
US 2015/0256924 A1    Sep. 10, 2015

Related U.S. Application Data

(60) Provisional application No. 61/704,845, filed on Sep. 24, 2012.

(30) Foreign Application Priority Data

Sep. 24, 2012    (GB) .................................... 1217002.3

(51) Int. Cl.
*H04R 1/28*       (2006.01)
*H04R 7/20*       (2006.01)
(Continued)

(52) U.S. Cl.
CPC .......... *H04R 1/2892* (2013.01); *H04R 1/222* (2013.01); *H04R 7/20* (2013.01); *H04R 19/005* (2013.01);
(Continued)

(58) Field of Classification Search
CPC ................................................... H01R 1/2892
See application file for complete search history.

(56) References Cited

U.S. PATENT DOCUMENTS

| 5,111,693 A | 5/1992 | Greiff |
| 6,641,273 B1 | 11/2003 | Staker |

(Continued)

FOREIGN PATENT DOCUMENTS

| DE | 4129218 A | 3/1993 |
| EP | 1950174 A2 | 7/2008 |

(Continued)

OTHER PUBLICATIONS

Combined Search and Examination Report, Application No. GB1217002.3, Dec. 17, 2012, 5 pages.

(Continued)

*Primary Examiner* — Alexander Ghyka
(74) *Attorney, Agent, or Firm* — Jackson Walker L.L.P.

(57) ABSTRACT

This application relates to MEMS devices, especially MEMS capacitive transducers and to processes for forming such MEMS transducer that provide increased robustness and resilience to acoustic shock. The application describes a MEMS transducer having a flexible membrane (101) supported relative to a first surface of a substrate (105) which has one or more cavities therein, e.g. to provide an acoustic volume. A stop structure (401, 402) is positioned so as to be contactable by the membrane when deflected so as to limit the amount of deflection of the membrane. The stop structure defines one or more openings to the one or more substrate cavities and comprises at least one narrow support element (401, 402) within or between said one or more openings. The stop structure thus limits the amount of membrane deflection, thus reducing the stress experienced at the edges and prevents the membrane from contacting a sharp edge of a substrate cavity. As the stop structure (Continued)

comprises narrow support elements any performance impact on the transducer is limited.

2 Claims, 7 Drawing Sheets

(51) Int. Cl.
*H04R 19/00* (2006.01)
*H04R 1/22* (2006.01)
*H04R 19/04* (2006.01)
*H04R 31/00* (2006.01)

(52) U.S. Cl.
CPC .......... *H04R 19/04* (2013.01); *H04R 31/003* (2013.01); *H04R 2201/003* (2013.01); *H04R 2207/021* (2013.01)

(56) References Cited

U.S. PATENT DOCUMENTS

| | | |
|---|---|---|
| 2005/0016271 A1 | 1/2005 | Hashimoto et al. |
| 2008/0031476 A1 | 2/2008 | Wang |
| 2009/0309173 A1 | 12/2009 | Nakatani et al. |
| 2010/0002895 A1 | 1/2010 | Notake et al. |
| 2011/0048131 A1 | 3/2011 | Reimuth |

FOREIGN PATENT DOCUMENTS

| | | |
|---|---|---|
| JP | 2004223713 A | 8/2004 |
| JP | 2008085507 A | 4/2008 |
| JP | 2011044890 | 3/2011 |

OTHER PUBLICATIONS

International Search Report and Written Opinion, International Application No. PCT/GB2013/052460, Dec. 18, 2013, 10 pages.

MEMS DEVICE AND PROCESS

BACKGROUND OF THE INVENTION

1. Field of the Invention

This invention relates to a micro-electro-mechanical system (MEMS) device and process, and in particular to a MEMS device and process relating to a transducer, for example a capacitive microphone.

2. Description of the Related Art

Various MEMS devices are becoming increasingly popular. MEMS transducers, and especially MEMS capacitive microphones, are increasingly being used in portable electronic devices such as mobile telephones and portable computing devices.

Microphone devices formed using MEMS fabrication processes typically comprise one or more membranes with electrodes for read-out/drive deposited on the membranes and/or a substrate. In the case of MEMS pressure sensors and microphones, the read out is usually accomplished by measuring the capacitance between the electrodes. In the case of output transducers, the membrane is moved by electrostatic forces generated by varying a potential difference applied across the electrodes.

Figure 1A:
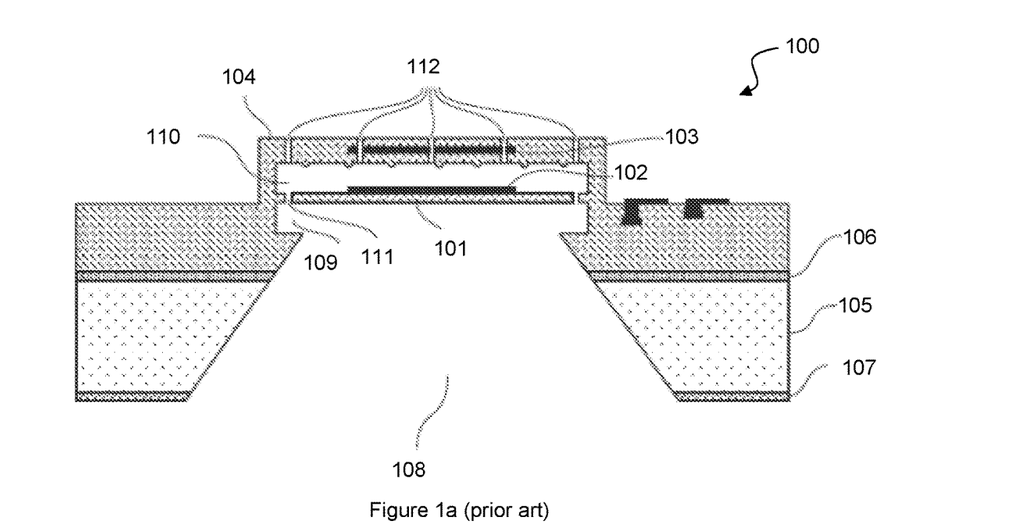
FIGS. 1a and 1b illustrate a known capacitive MEMS transducer in section and cut-away perspective views.
Figure 1B:
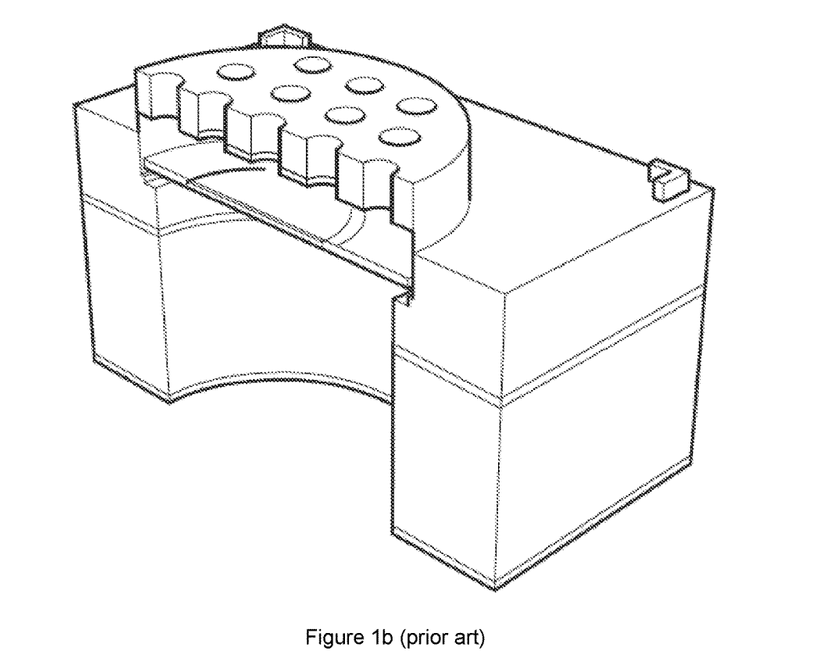

FIGS. 1a and 1b show a schematic diagram and a perspective view, respectively, of known capacitive MEMS microphone devices 100. The capacitive microphone device 100 comprises a membrane layer 101 which forms a flexible membrane which is free to move in response to pressure differences generated by sound waves. A first electrode 102 is mechanically coupled to the flexible membrane, and together they form a first capacitive plate of the capacitive microphone device. A second electrode 103 is mechanically coupled to a generally rigid structural layer or back-plate 104, which together form a second capacitive plate of the capacitive microphone device. In the example shown in FIG. 1a the second electrode 103 is embedded within the back-plate structure 104.

The capacitive microphone is formed on a substrate 105, for example a silicon wafer which may have upper and lower oxide layers 106, 107 formed thereon. A cavity 108 in the substrate and in any overlying layers (hereinafter referred to as a substrate cavity) is provided below the membrane, and may be formed using a "back-etch" through the substrate 105. The substrate cavity 108 connects to a first cavity 109 located directly below the membrane. These cavities 108 and 109 may collectively provide an acoustic volume thus allowing movement of the membrane in response to an acoustic stimulus. Interposed between the first and second electrodes 102 and 103 is a second cavity 110

The first cavity 109 may be formed using a first sacrificial layer during the fabrication process, i.e. using a material to define the first cavity which can subsequently be removed, and depositing the membrane layer 101 over the first sacrificial material. Formation of the first cavity 109 using a sacrificial layer means that subsequent etching of the substrate cavity 108 does not play any part in defining the diameter of the membrane. Instead, the diameter of the membrane is defined by the diameter of the first cavity 109 (which in turn is defined by the diameter of the first sacrificial layer) in combination with the diameter of the second cavity 110 (which in turn may be defined by the diameter of a second sacrificial layer). The diameter of the first cavity 109 formed using the first sacrificial layer can be controlled more accurately than the diameter of a back-etch process performed using a wet-etch or a dry-etch. Etching the substrate cavity 108 will therefore define an opening in the surface of the substrate underlying the membrane 101.

A plurality of holes, hereinafter referred to as bleed holes 111, connect the first cavity 109 and the second cavity 110.

As mentioned the membrane may be formed by depositing at least one membrane layer 101 over a first sacrificial material. In this way the material of the membrane layer(s) may extend into the supporting structure, i.e. the side walls, supporting the membrane. The membrane and back-plate layer may be formed from substantially the same material as one another, for instance both the membrane and back-plate may be formed by depositing silicon nitride layers. The membrane layer may be dimensioned to have the required flexibility whereas the back-plate may be deposited to be a thicker and therefore more rigid structure. Additionally various other material layers could be used in forming the back-plate 104 to control the properties thereof. The use of a silicon nitride material system is advantageous in many ways, although other materials may be used, for instance MEMS transducers using polysilicon membranes are known.

In some applications, the microphone may be arranged in use such that incident sound is received via the back-plate. In such embodiments a further plurality of holes, hereinafter referred to as acoustic holes 112, are arranged in the back-plate 104 so as to allow free movement of air molecules, such that the sound waves can enter the second cavity 110. The first and second cavities 109 and 110 in association with the substrate cavity 108 allow the membrane 101 to move in response to the sound waves entering via the acoustic holes 112 in the back-plate 104. In such instances the substrate cavity 108 is conventionally termed a "back volume", and it may be substantially sealed.

In other applications, the microphone may be arranged so that sound may be received via the substrate cavity 108 in use. In such applications the back-plate 104 is typically still provided with a plurality of holes to allow air to freely move between the second cavity and a further volume above the back-plate.

In other applications the microphone may be arranged such that, some sound components may be received via the substrate cavity 108 and other sound components may be received via the back-plate 104.

It should also be noted that whilst FIG. 1 shows the back-plate 104 being supported on the opposite side of the membrane to the substrate 105, arrangements are known where the back-plate 104 is formed closest to the substrate with the membrane layer 101 supported above it.

In use, in response to a sound wave corresponding to a pressure wave incident on the microphone, the membrane is deformed slightly from its equilibrium position. The distance between the lower electrode 102 and the upper electrode 103 is correspondingly altered, giving rise to a change in capacitance between the two electrodes that is subsequently detected by electronic circuitry (not shown). The bleed holes allow the pressure in the first and second cavities to equalise over a relatively long timescales (in acoustic frequency terms) which reduces the effect of low frequency pressure variations, e.g. arising from temperature variations and the like, but without impacting on sensitivity at the desired acoustic frequencies.

Figure 2A:
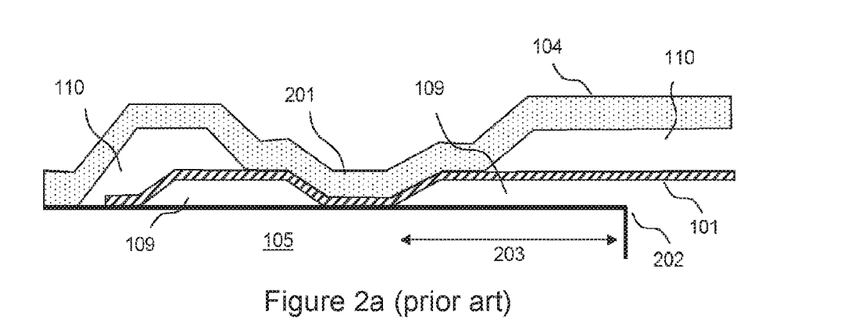
FIGS. 2a and 2b illustrate sectional and perspective views of another known capacitive MEMS transducer.
Figure 2B:
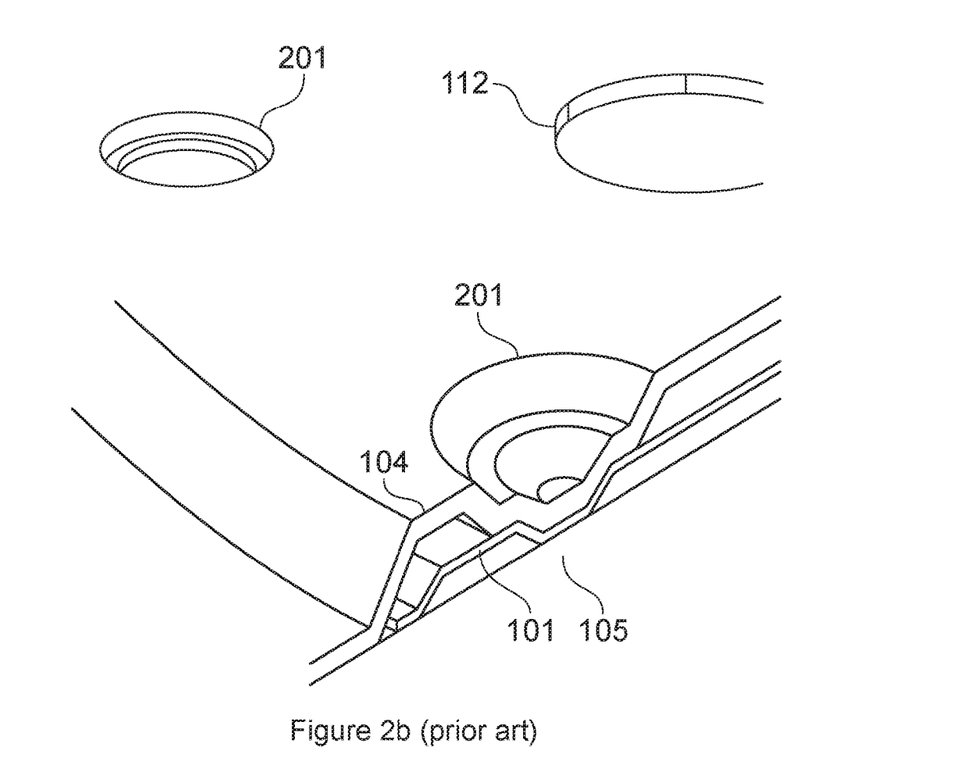

The transducer shown in FIG. 1 is illustrated with substantially vertical side walls supporting the membrane layer 101 in spaced relation from the back-plate 104. Given the nature of the deposition process this can lead to a high stress concentration at the corners formed in the material layer that forms the membrane. Sloped or slanted side walls may be used to reduce the stress concentration. Additionally or alternatively it is known to include a number of support structures such as columns to help support the membrane in a way which reduces stress concentration as illustrated in FIGS. 2a and 2b. FIGS. 2a and 2b illustrate the periphery of a MEMS microphone structure in perspective and cross sectional views respectively, where similar components are identified by the same numerals as used in FIG. 1.

In this example the MEMS device 200 is formed with a plurality of support structures 201, which in this example are formed as supporting columns, arranged around the periphery of the membrane. The columns are formed by patterning the first sacrificial material used to define the first cavity 109 such that the substrate 105 is exposed in a number of areas before depositing the material forming the membrane layer 101 (FIG. 2b shows one membrane layer being deposited directly on the substrate but it will be appreciated that that there may be various intermediate layers on the substrate and the membrane may be formed by depositing multiple membrane layers). Likewise the second sacrificial material used to define the second cavity 110 is patterned so that membrane layer 101 is exposed in the same areas prior to depositing the material of the back-plate layer. This results in a plurality of columns being formed around the periphery of the membrane which provide support to the membrane but with a reduced stress concentration compared to the arrangement shown in FIG. 1. The columns are preferably formed with a stepped profile and/or slanted side walls to minimise stress. This process can lead to dimples in the upper surface of the back-plate layer in the area of the columns.

MEMS transducers such as those shown in FIGS. 1 and 2 may usefully be used in a range of devices, including portable devices. Especially when used for portable devices it is desirable that the MEMS transducers are sufficiently rugged to survive expected handling and use of the device. There is therefore a general desire to improve the resilience of MEMS devices.

The present invention is therefore concerned with improving the robustness and/or resilience of MEMS devices.

SUMMARY OF THE INVENTION

Thus according to an aspect of the present invention there is provided a MEMS transducer comprising:
  a flexible membrane supported relative to a first surface of a substrate, the substrate having one or more cavities therein; and
  a stop structure positioned on one side of the membrane so as to be contactable by the membrane when deflected so as to limit the amount of deflection of the membrane;
  wherein the stop structure defines one or more openings to said one or more cavities and comprises at least one narrow support element within or between said one or more openings.

Advantageously the total area of said at least one narrow support elements within or between said one or more openings is less than the total area of said one or more openings.

At least one of the support narrow elements may extend from a side wall defining said one or more openings. At least one narrow support element may comprise a beam structure. There may be at least three narrow support elements extending from a side wall defining said one or more openings and the support elements may be substantially regularly spaced around the perimeter of the one or more openings.

At least one narrow support element may form a contact element positioned such that the membrane will make contact with the contact element if subject to a relatively large deflection towards the first surface. The contact element may be ring-shaped.

The narrow support element(s) may have a width within a plane parallel to the first surface of 100 µm or less. The width of the face of a narrow support element nearest to the membrane may be 50 µm or less. The width may taper, such that the element is narrowest at the face which is nearest to the membrane.

The stop structure may be symmetrical in plane parallel to said first surface.

At least part of the stop structure may be located within an area corresponding to a central portion of the membrane.

The stop structure may or may not extend all the way through the substrate. The stop structure may have a thickness in a direction perpendicular to said first which is 50 µm or greater. The stop structure may comprise a layer of patterned dielectric material and/or a layer of semiconductor material that forms a substrate for the transducer.

The MEMS transducer may have a back-plate structure with the membrane layer being supported to be flexible with respect to said back-plate structure and the back-plate structure being on the opposite side of the substrate to the stop structure. The total area of the one or more openings of the stop structure may be greater than the total area of any openings in the back-plate structure, for example at least twice the area.

The transducer may be a capacitive sensor such as a microphone. The transducer may comprise readout circuitry. The transducer may be located within a package having a sound port. The transducer may be implemented in an electronic device which may be at least one of: a portable device; a battery powered device; an audio device; a computing device; a communications device; a personal media player; a mobile telephone; a games device; and a voice controlled device.

In a further aspect the invention provides a method of forming a MEMS transducer comprising:
  forming one or more layers on the front side of a substrate including at least one membrane layer; and
  etching one or more cavities through the substrate from the rear side;
  wherein the method comprises selectively patterning at least one of said layer and/or said substrate to provide a stop structure configured to limit the amount of deflection of the membrane;
  wherein the stop structure defines one or more openings to said one or more cavities and comprises at least one narrow support element within or between said one or more openings.

The method may be used to form transducer according to any of the embodiments discussed above. In particular the method may comprise selectively etching only part of the said substrate so as to leave at least some substrate in the region of the front side of the substrate to form at least part of the stop structure. Selectively etching only part of the said substrate may comprise selectively masking the rear side of the substrate and etching throughout the substrate so that the stop structure extends throughout the entire substrate. Alternatively selectively etching only part of the said substrate may comprise at least: a first step of selectively masking the rear side of the substrate and etching partly through the substrate; and a second step of changing the masking and etching through the substrate so that the stop structure does not extend throughout the entire substrate.

The method may comprise, prior to forming said membrane layer: forming a first layer of material on the substrate in the area where the one or more cavities will be etched, said first layer being patterned to form at least part of the stop structure, and filling any gaps in the patterned first layer in the area to be covered by the membrane with sacrificial material.

In a further aspect of the invention there is provided a MEMS transducer comprising:
a flexible membrane supported relative to a substrate, the substrate having one or more cavities through the substrate; and
a stop structure disposed within or between said one or more cavities so as to limit the amount of deflection of the membrane into said cavities;
wherein the total area of stop structure within or between said one or more cavities is substantially less than the total area of the one or more cavities between said stop structure.

In yet a further aspect of the invention there is provided a MEMS transducer comprising:
a flexible membrane; and
a stop structure positioned on one side of the membrane so as to be contactable by the membrane when deflected so as to limit the amount of deflection of the membrane;
wherein the stop structure comprises a plurality of interconnecting narrow members contactable by the membrane when deflected.

In another aspect of the invention there is provided a MEMS transducer comprising: a substrate;
a back-plate supported relative to the substrate and comprising a first electrode;
a flexible membrane, having a second electrode, the membrane being supported to be flexible between the substrate and back-plate,
the flexible membrane being supported above one or more cavities through the substrate; and
a stop structure disposed above, between or within said one or more cavities so as to limit the amount of deflection of the membrane away from the back-plate;
wherein the stop structure does not form or carry an electrode.

BRIEF DESCRIPTION OF THE DRAWINGS

The invention will now be described by way of example only, with reference to the accompanying drawings, of which.

DETAILED DESCRIPTION OF THE PREFERRED EMBODIMENTS

As described above MEMS transducers such as shown in FIGS. 1 and 2 may be usefully employed in a variety of different devices and increasingly are becoming popular for use in portable electronic devices such as mobile telephones, mobile computing devices and/or personal media players and the like.

To be useful for use in portable electronic devices such transducers should be able to survive the expected handling and use of the portable device, which may include the device being accidentally dropped.

If a device such as a mobile telephone is subject to a fall, this can result not only in a mechanical shock due to impact but also a high pressure impulse incident on a MEMS transducer. For example, a mobile telephone may have a sound port for a MEMS microphone on one face of the device. If the device falls onto that face, some air may be compressed by the falling device and forced into the sound port. This may result in a high pressure impulse incident on the transducer. It has been found that in conventional MEMS transducers of the form described above high pressure impulses can potentially lead to damage of the transducer.

Referring again FIGS. 2a and 2b, as previously described, a MEMS transducer 200 may have a membrane layer 101 and a back-plate layer 104 formed so that a membrane is suspended above a surface of a substrate 105 to define a first cavity 109 and the back-plate 104 is suspended above the membrane to form a second cavity 110.

As mentioned above a sacrificial material may be used to define the dimensions of the first cavity and hence the dimensions of the membrane. As discussed sacrificial material may be deposited on substrate 105 and patterned relatively accurately to provide good control over the membrane dimensions. A substrate cavity is also provided in the substrate 105, typically by means of a back etch. To ensure that it is the dimensions of the first cavity 109 which determine the membrane dimensions, the substrate cavity is arranged to have a smaller diameter than the first cavity at the point 202 where the substrate cavity and first cavity meet, in other words the opening of the substrate cavity at the surface of the substrate has a smaller diameter than the first cavity. This means that in such a structure the membrane is suspended above a section of the substrate, indicated by arrow 203, before reaching the opening of the substrate cavity, i.e. the opening of the substrate cavity 108 in the surface of the substrate is within the area of the flexible membrane.

The sacrificial material used to define the first and second cavities is dimensioned so as to provide a desired equilibrium separation between the membrane layer 101 and the substrate 105 and also between the membrane layer 101 and the back-plate 104 so as to provide good sensitivity and dynamic range in use. In normal operation the membrane may deform within the volume defined by the first and second cavities without contacting the back-plate and/or substrate 105.

Note that the substrate 105 shown in FIG. 2a is a substrate upon which the sacrificial material is deposited and from which the membrane will be suspended in use. This may be a suitably prepared silicon substrate but it will be appreciated various layers may be provided onto a silicon wafer before the deposition of the sacrificial material defining the first cavity. These layers may include one or more dielectric layers, which may include layers of the same type of material as is used to form the membrane layer (such as illustrated in FIG. 1). It will therefore be appreciated that the substrate 105 shown in FIG. 2a may comprise various layers and may include layers that have been deposited.

Figure 3:
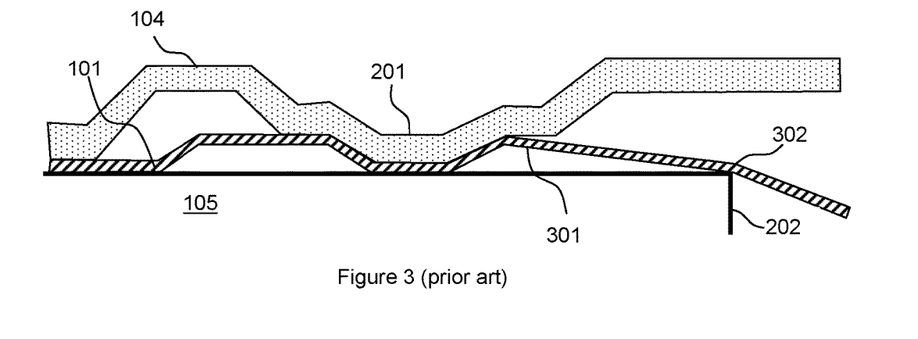
FIG. 3 illustrates how a high pressure event may affect the membrane.

In response to a high pressure impulse the membrane layer 101 may exhibit a greater amount of deformation than usual. FIG. 3 illustrates the situation where the membrane has been deformed downwards following a high pressure event.

Consider the situation where the microphone is arranged to receive incident sound from a sound port arranged above the back-plate 104 and the sound port pressure suddenly increases, for instance as a result of air trapped when the device falls being forced into the sound port. This may result the pressure in the second cavity 110 being significantly greater than the pressure in the first cavity 109, displacing the membrane downwards to greater extent than is usual. This may result in a relatively large stress at point 301 where membrane layer 101 forms part of the sidewall of supporting structure 201 and, in some instances, delamination of the membrane layer from the rest of the sidewall structure. Further, if the pressure difference is great enough the membrane may make contact with the substrate 105 at the edge of the substrate defined by the side wall 202 of the opening of the substrate cavity 108. Typically the edge of the substrate at the location of the opening of a substrate cavity has a relatively sharp angle and thus the membrane may be deformed round this edge, leading to a large stress concentration at this point 302.

As mentioned previously the membrane layer 101 will typically be formed from one or more thin layers of semiconductor material, such as silicon nitride. Whilst such a material can be flexible when subject to even stresses if there is a significant localised out-of-plane stress, such as may be introduced into the membrane at point 302 by contact with the edge of the opening of the substrate cavity 108, the membrane material can relatively brittle. Thus contact between the membrane and the edge of the opening of the substrate cavity in this way can lead to damage such as cracking of the membrane.

It should be appreciated that this situation can also when sound is received via the substrate cavity 108. In such an instance a sudden increase in pressure in the sound port, and hence the substrate cavity, will lead to a pressure difference between the first cavity and the second cavity. This may initially cause the membrane to be deflected upwards, where it may make contact with the back-plate 104. As the high pressure caused by trapped air may persist for a relatively long time, the pressure in the first and second cavities may equalise by virtue of the bleed holes (not shown in FIG. 2 or 3) discussed above with relation to FIG. 1. Thus the pressure in the second cavity may increase until the pressures are equalized. However once air is no longer being forced into the sound port the pressure in the sound port will reduce quite quickly. Thus the pressure in the substrate cavity and first cavity will quickly reduce. At this point the pressure in the second cavity may be significantly greater than the pressure in the first cavity and thus the membrane may be deformed downwards to the extent shown in FIG. 3.

To reduce the likelihood of damage in such high pressure situations, embodiments of the present invention provide MEMS transducers having a flexible membrane supported relative to a first surface of a substrate, the substrate having one or more cavities therein (e.g. to provide an acoustic volume) and a stop structure positioned on one side of the membrane so as to be contactable by the membrane when deflected so as to limit the amount of deflection of the membrane. The stop structure defines one or more openings to the one or more cavities in the substrate and comprises at least one narrow support element within or between the one or more openings.

Thus embodiments of the present invention thus provide a stop structure with at least one narrow support element within or between the opening(s) of the substrate cavity or cavities. In other words the stop structure has at least one narrow support element within a perimeter defined by the outer edges of the one or more openings. The narrow support element forms at least part of a structure that is contactable by the membrane so as to support the membrane in a high pressure differential situation and limit the amount of deflection of the membrane. The support element is narrow, i.e. has a relatively low width (in a plane parallel to the first surface of the substrate) compared to its width and thus does not significantly impact on device performance.

As will be described in more detail later the stop structure may be provided just at the first surface and thus a narrow support element of the stop structure may be positioned within a substrate cavity. In some embodiments however the stop structure may be provided to be continuous throughout the substrate, thus meaning there are separate cavities in the substrate. In this instance the stop structure is provided between the various cavities. In this instance the parts of the substrate between the cavities are within area perimeter defined by, i.e. enclosing, the outer edges of the cavities. In other words the stop structure is provided within a perimeter that, in a conventional transducer structure, would usually be the perimeter of a single substrate cavity.

The stop structure is provided at or near to the first surface and acts to limit the extent of deflection of the membrane. In particular the stop structure limits deflection of the membrane into a substrate cavity. Thus, in situations of high pressure differential, the membrane may deflect and come into contact with the stop structure. This contact will occur away from the edge of the substrate cavity and closer to the central portion of the membrane (which may be a stronger part of the membrane due to the presence of a metal electrode layer in this region) than would be the case in the absence of the stop structure. The contact between the membrane and the stop structure will induce less stress in the membrane than contact with the side wall of a substrate cavity as discussed earlier. Thus the presence of the stop structure can help reduce membrane stress and reduce the likelihood of membrane damage. Also, even for embodiments in which the membrane would not make contact with the side wall of the substrate cavity a very large membrane deflection may nevertheless result in damage. The stop structure limits the amount of membrane deflection. The stop structure can further provide support to the membrane in a high pressure differential situation.

As mentioned previously typically there may be a back-plate on one side of the membrane which may be positioned so the back-plate will limit the amount of deflection of the membrane in the direction of the back-plate. Embodiments of the present invention deliberately introduce structure on the opposite side of the membrane to the back-plate so as to limit the amount of membrane deflection away from the back-plate.

Figure 4A:
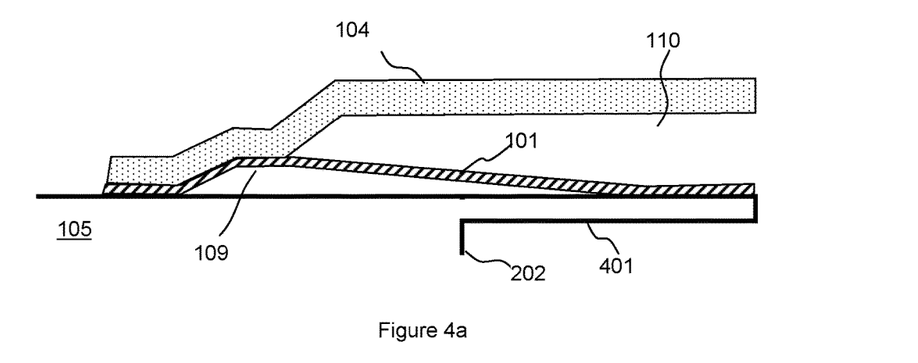
FIGS. 4a, 4b and 4c illustrate an embodiment of a MEMS transducer according to the present invention.
Figure 4B:
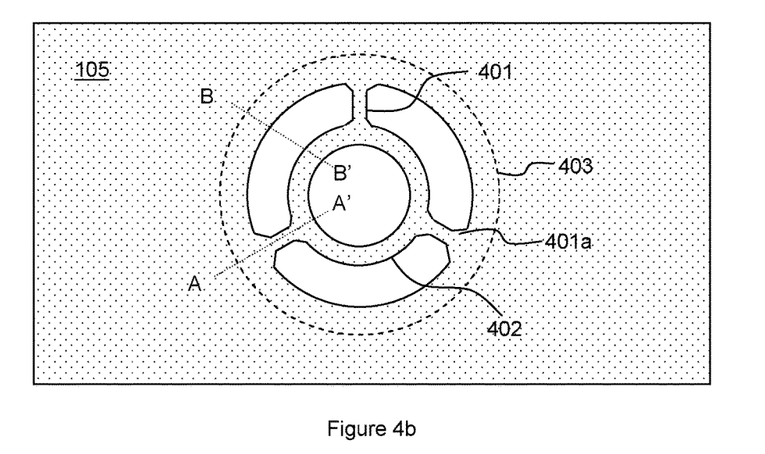
Figure 4C:
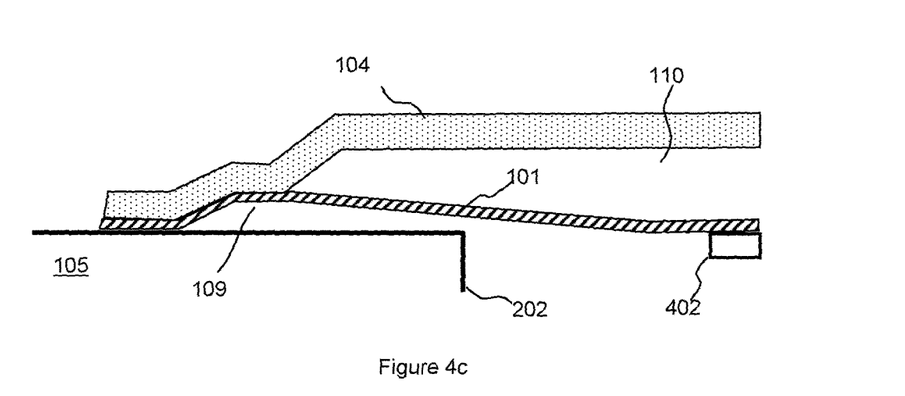

FIGS. 4a, 4b and 4c illustrate a MEMS transducer having a stop structure according to an embodiment of the present invention. FIG. 4a shows a sectional view of a transducer in the vicinity of the sidewall structure (which may be a sidewall of a supporting column such as described with reference to FIGS. 2*a* and 2*b*, or any type of supporting sidewall. In this embodiment there is an element 401 which extends from the side wall of the substrate 105 into the substrate cavity to form part of a stop structure.

FIG. 4*b* shows a plan view of the substrate 105 illustrating one example of a suitable stop structure. In this example the stop structure comprises a plurality of narrow support elements 401 extending from the side wall 202 defining the opening of the substrate cavity. The support elements comprise narrow structures, i.e. beam structures that are relatively long and thin in the plane of the substrate. The support elements 401 extend inwards from the perimeter of the substrate cavity and thus extend closer to the middle of the membrane (the extent of the flexible part of the membrane is indicated by dotted line 403). Thus, as shown in FIG. 4*a*, which represents a section along the line A-A' in FIG. 4*b*, as the membrane is increasingly deflected towards the substrate it may come into contact with the support elements 401. The support elements 401 will limit further deflection of the membrane and provide support to the membrane, thus preventing a significant local deformation of the membrane at any point such as described above with respect to FIG. 3.

In some embodiments the stop structure may simply comprise one, or preferably more, elongate elements extending into the substrate cavity at the first surface. However in the embodiments shown in FIG. 4*b* the narrow support elements may comprise a contact element 402 which is supported by the beam elements 401 extending from the side walls. The contact element 402 may be arranged such that the membrane will make contact with the contact element if subject to a relatively large deflection towards the substrate. In the embodiment shown in FIG. 4*b* the contact element is ring-shaped, i.e. generally circular or elliptic. Such an arrangement may be beneficial as the membrane may thus make contact with the contact element all around the ring substantially simultaneously, balancing stress across the membrane. Also such a structure avoids sharp corners or the like which could introduce localised stress points in the membrane. FIG. 4*c* illustrates a section along line B-B' of FIG. 4*b* and shows how the contact element 402 may support the membrane 101. The ends 401*a* of the support beams 401 may be flared where they join the contact element and/or sidewalls to avoid sharp corners.

Figure 5:
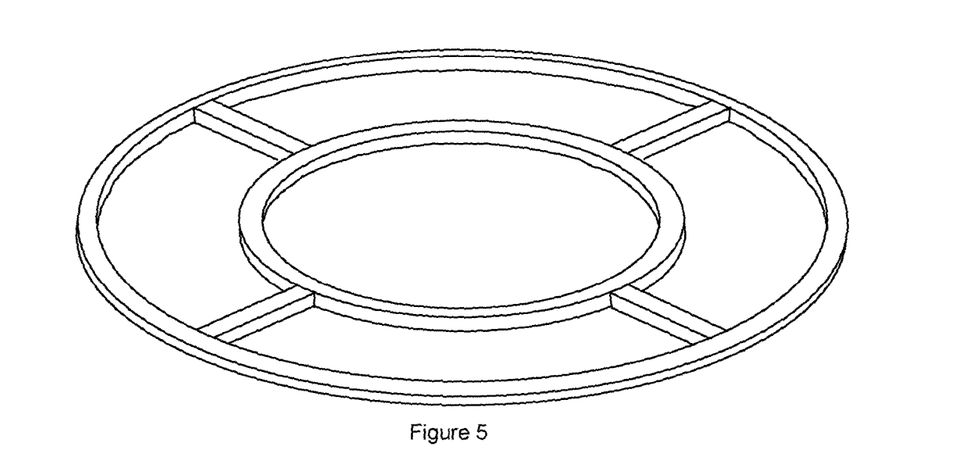
FIG. 5 illustrates a stop structure according to an embodiment of the present invention.

To provide sufficient support and support the membrane evenly there may be at least three support elements within the substrate cavity (whether or not they support a contact element) extending from the side wall. Conveniently such support elements are substantially regularly spaced around the perimeter of the opening of the substrate cavity and the stop structure may be symmetric in the plane of the substrate to evenly spread stresses. FIG. 5 shows a perspective view of an alternative embodiment of a stop structure, this embodiment having four evenly spaced support elements extending from the side wall to support a ring-shaped contact element. It will be understood however that other shapes and patterns of stop structure may be used, for instance an interconnecting lattice of support elements and/or supported contact elements of different shapes.

Whatever the shape or form of the stop structure at least part of the stop structure may advantageously be located within an area corresponding to a central portion of the membrane. This ensures that the stop structure can limit the deflection of the membrane before significant stresses build up, for example at the part of the membrane extending from the side wall. By central portion of the membrane is meant within half the radius of the centre of the membrane.

The use of a stop structure can provide significant advantages in handling membrane stresses such as may be experienced in high pressure situations. However the presence of material underlying and relatively close to the membrane (as is required for the stop structure) could impact on performance, especially for a microphone.

Referring back to FIG. 2*a*, in conventional MEMS microphones the size of area 203 where the membrane overlies the substrate and not the substrate cavity can impact on the signal-to-noise ratio due to the normal motion of the air molecules. Air in the vicinity of the substrate cavity is free to move in all directions. However air in the region 203 between the membrane and substrate will rebound from the solid substrate to impact on the membrane. The presence of a stop-structure can have a similar effect and increase the noise of the transducer.

The stop structure may therefore be arranged such that the ratio of open area to support element(s) is relatively high. For instance within a plane parallel to the first surface, the total area of narrow support element(s) within or between the one or more openings may be less than the area of said one or more openings. In other words in an area defined by, i.e. enclosing, the outer edges of the cavities, at least half of such area may be free from any stop structure. Referring back to FIG. 4*b* (which is not to scale) at least half the area defined by a circle enclosing the three outer openings between the support elements 401 may advantageously be free of the stop structure, i.e. lacking either a support element that extends from the sidewall or a supported contact element. At least 75% of this area may be free of the stop structure and in some embodiments the stop structure may comprise 10% of less of this area.

The elements of the stop structure are preferably narrow, i.e. have a relatively low width (in a plane parallel to the first surface of the substrate). For example the support elements (which may include the beam like structures 401 and/or the contact element 402) may have a width of 100 μm or less. In some embodiments the width of the support elements may be 50 μm or less. Thus the elements forming the stop structure may comprise substantially elongate elements, i.e. having a length much greater than their width. Note in terms of the annular contact element 402 the width is the width of the annulus, i.e. the distance between the inner and outer perimeters, and the length is taken to be the circumference.

It will be understood that the impact on noise arises from air being restricted in the area between the membrane and the element(s) of the stop structure. Thus it is the width of the upper face of the support element, i.e. the face of the element nearest to the membrane, which is important. Thus the limits discussed above may apply to the upper face of such elements and the element may be thicker at a point further away from the membrane. In other words at least one of the narrow support elements may have a width that tapers, such that the support element is narrowest at the face which is nearest to the membrane.

As shown in FIG. 4*a* the stop structure may not extend all the way through the substrate and may be disposed only in the vicinity of the first surface of the substrate, i.e. at the top of the substrate cavity. Thus the stop structure may be relatively thin, in direction perpendicular to the membrane, compared to the substrate. This can be advantageous as it means that the stop structure doesn't have any significant impact on the functioning of the substrate cavity, i.e. as an acoustic volume. The stop structure is simply arranged at or towards the opening of the substrate cavity to limit travel of the membrane into the substrate cavity.

The stop structure should however be thick enough to be able to support the membrane. For a bulk silicon substrate the stop structure may be at least 50 μm thick. However if the substrate comprises other layers of material it may be possible to use less thick layers.

In some embodiments however the stop structure may be at least partly formed by the material of the substrate and may extend all the way through the substrate.

Figure 6A:
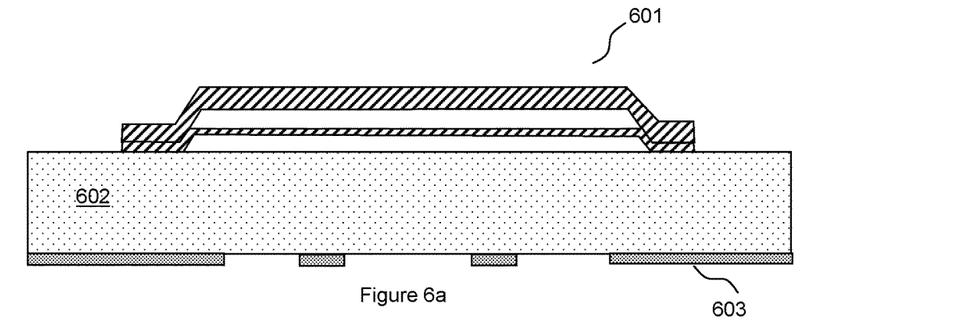
FIGS. 6a and 6b illustrate one method of forming a transducer according to an embodiment of the present invention.
Figure 6B:
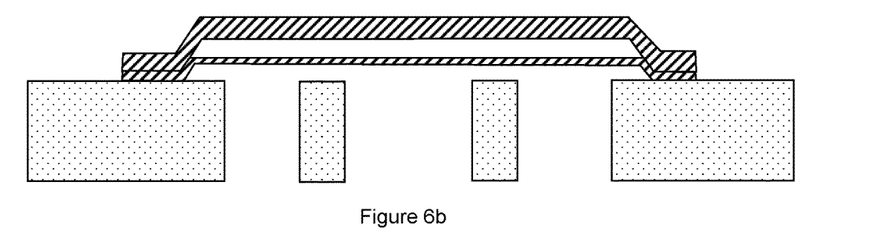

The stop structure may be formed in the substrate by selectively etching the substrate to form substrate cavities as illustrated in FIGS. 6a and 6b. FIG. 6a shows a transducer structure formed on a substrate 602. The transducer structure may be fabricated by any known technique and the substrate 602 may comprise various layers. The rear surface of substrate 602 may be patterned with mask material 603 to define the desired outline of the substrate cavities and the stop structure and then etched to leave a transducer structure with a stop-structure extending all the way through the substrate. The various cavities through the substrate collectively form an acoustic volume.

Figure 7A:
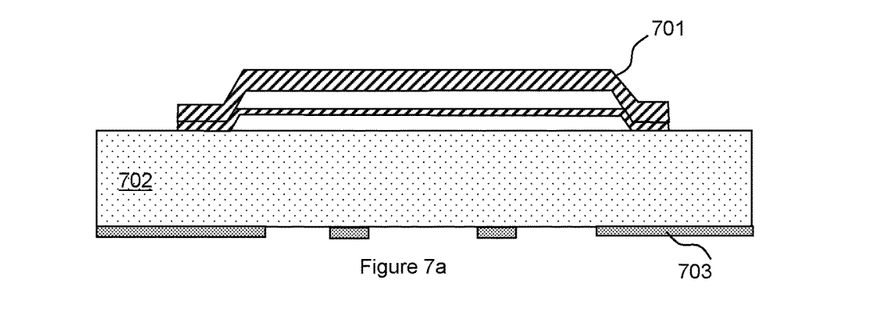
FIGS. 7a-c illustrate another method of forming a transducer according to an embodiment of the present invention.
Figure 7B:
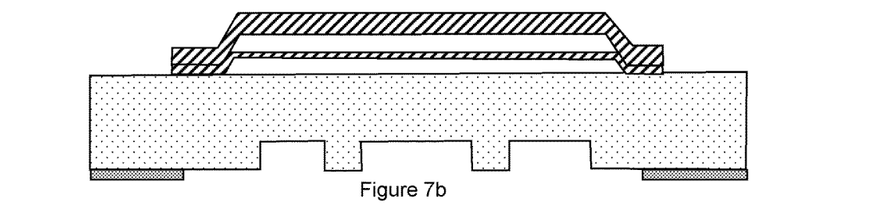
Figure 7C:
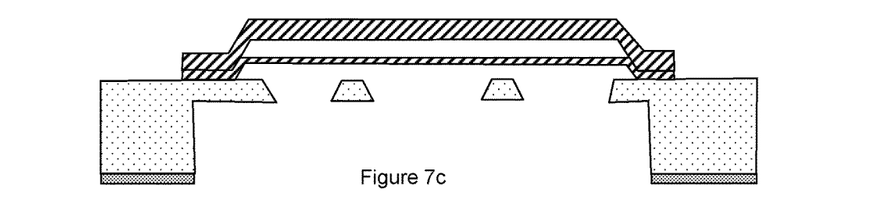

Alternatively a two-stage etch could be used to define the stop structure just in the top part of the substrate (i.e. that nearest the membrane) as shown in FIGS. 7a-c. FIG. 7a again shows a transducer structure formed on a substrate 702. The rear surface of substrate 702 may be patterned with mask material 703 to define the desired outline of the opening of substrate cavity and the stop structure and then partially etched. The etching process is then stopped and some of the masking material is removed to expose more areas from etching (new areas could also be masked if required) as shown in FIG. 7b. A further etching step is then performed to etch completely through the substrate to leave a transducer structure, such as shown in FIG. 7b with a substrate cavity through the substrate and a stop-structure just at the first surface of the substrate. It should be noted that the etch process may inherently produce tapering or trapezoidal cross sections which have the benefit of reducing the footprint of the top of the stop structure elements whilst providing a thicker and thus sturdier cross section lower down.

Figure 8:
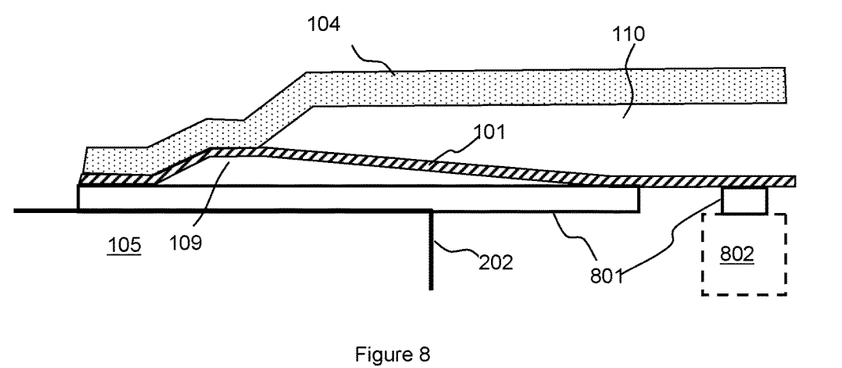
FIG. 8 illustrates a further embodiment of the invention.

It is also possible to form the stop structure by patterning a layer formed on a substrate as part of the process step during fabrication of the transducer structure. Thus, as shown in FIG. 8 the transducer may comprise a stop structure having elements 801 formed from a layer of material, such as a dielectric material that is deposited on the substrate and patterned into a desired shape before formation of the membrane 101 and back-plate 104.

Figure 9A:
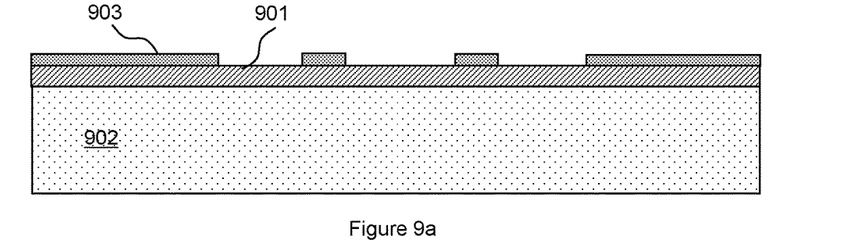
FIGS. 9a-d illustrate a further suitable process for forming a MEMS transducer according to an embodiment of the invention.
Figure 9B:
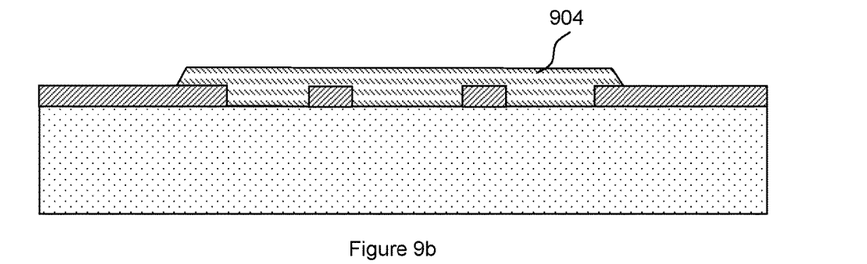
Figure 9C:
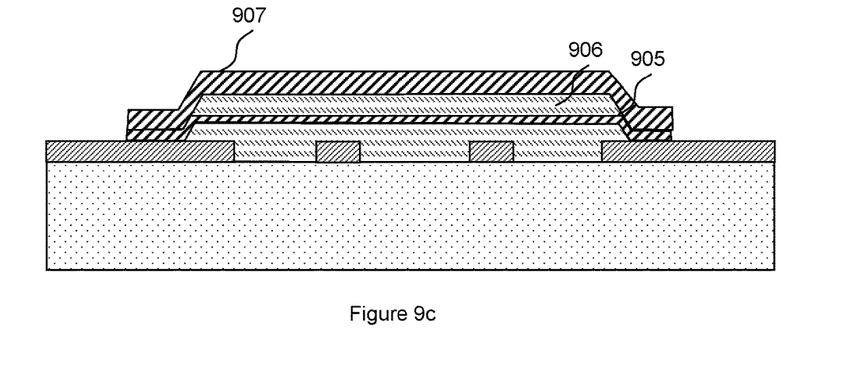

FIGS. 9a-d illustrate how such a process may be implemented. As shown in FIG. 9a layer of dielectric material 901 may be deposited on substrate 902. A mask layer 903 may be used to define the desired shape of the stop structure. The dielectric layer may then be etched and the mask material removed. A sacrificial material 904 may then be deposited over the patterned dielectric and shaped to define the first cavity.

Membrane layers 905 may then be deposited followed by a further sacrificial material 906 to define the second cavity and then back-plate layers 907.

Figure 9D:
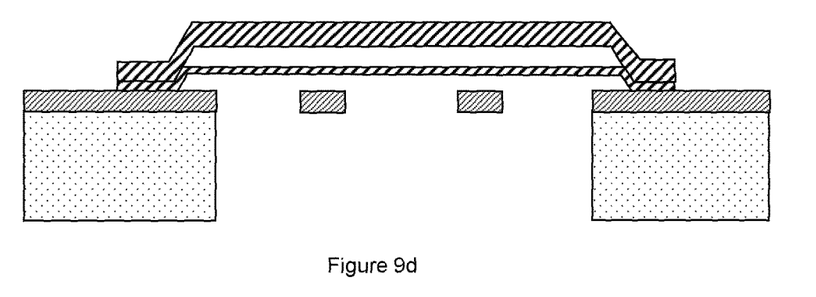

A substrate cavity may then be back etched through the substrate and the sacrificial material removed to leave the transducer structure and stop structure formed by the dielectric layer—which may have the form such as shown in FIG. 5 for example.

Using a patterned dielectric layer to define the stop structure may involve additional process steps compared to forming the stop structure in the back etch steps (although some process flows may already involve patterning a dielectric layer before depositing the membrane layer, particularly if these dielectric layers are also used to define structures in co-integrated electronic circuitry). However it can be advantageous to define the stop structure in the dielectric material as the processing steps used at this stage allow much finer control over dimensions than is possible in the back-etch stage. This can be useful for ensuring that the upper surface of the stop structure is relatively narrow.

It would be possible to form a stop structure using both a deposited layer which is patterned prior to transducer fabrication and also a layer of the substrate which is patterned during the back etch. Thus referring back to FIG. 8 at least part of the stop structure 801 may be formed from a patterned dielectric layer and part may be formed from the underlying substrate 802. This may allow the width of the upper part of the stop structure to be accurately defined using a relatively thin dielectric layer whilst providing additional thickness and thus strength to the stop structure from the substrate material 802.

In general then the embodiments of the present invention provide for a transducer having a stop structure formed over or within part of a substrate cavity or cavities to limit the possible travel of the membrane into the substrate cavity or cavities but which does not significantly impact on device performance. It should be noted that the stop structure is not the same as a back-plate. Some MEMS devices are known with two back-plates where both back-plate carry electrodes used in device operation. It will be seen from FIG. 5 that the stop structure does not have the form of a back-plate and it does not form part of nor carry any electrode. One skilled in the art will appreciate that a back-plate is provided in order to provide a relatively large degree of overlap between the area of the membrane and area of back-plate electrode to maximise capacitance. Embodiments of the present invention however in effect minimise any overlap area to reduce any detrimental noise impact and to reduce stray capacitance.

In general therefore embodiments of the invention relate to MEMS transducers comprising: a flexible membrane supported relative to a substrate, the substrate having one or more cavities through the substrate; with a stop structure disposed within or between said one or more cavities so as to limit the amount of deflection of the membrane into the one or more cavities. The area of the stop structure within or between said one or more cavities is substantially less than the area of the one or more cavities between said stop structure.

Embodiments also relate to MEMS transducers comprising: a flexible membrane; with a stop structure positioned on one side of the membrane so as to be contactable by the membrane when deflected so as to limit the amount of deflection of the membrane (away from a back-plate); wherein the stop structure comprises a plurality of interconnecting narrow members.

Embodiments also relate to MEMS transducers comprising: a substrate; a back-plate supported relative to the substrate and having a first electrode; and a flexible membrane, having a second electrode. The membrane is supported to be flexible between the substrate and back-plate, and is supported above one or more cavities through the substrate. A stop structure is disposed above, between or within said one or more cavities so as to limit the amount of deflection of the membrane away from the back plate wherein the stop structure does not form or carry an electrode.

Although the various embodiments describe a MEMS capacitive microphone, the invention is also applicable to any form of MEMS transducers other than microphones, for example pressure sensors or ultrasonic transmitters/receivers.

Embodiments of the invention may be usefully implemented in a range of different material systems, however the embodiments described herein are particularly advantageous for MEMS transducers having membrane layers comprising silicon nitride.

It is noted that the embodiments described above may be used in a range of devices, including, but not limited to: analogue microphones, digital microphones, pressure sensor or ultrasonic transducers. The invention may also be used in a number of applications, including, but not limited to, consumer applications, medical applications, industrial applications and automotive applications. For example, typical consumer applications include portable audio players, laptops, mobile phones, PDAs and personal computers. Embodiments of the invention may be used in voice controlled or voice activated devices. Typical medical applications include hearing aids. Typical industrial applications include active noise cancellation. Typical automotive applications include hands-free sets, acoustic crash sensors and active noise cancellation.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference signs in the claims shall not be construed so as to limit their scope.

The invention claimed is:

1. A MEMS transducer comprising:
   a flexible membrane supported relative to a first surface of a substrate, the substrate having one or more cavities therein; and
   a stop structure positioned on one side of the membrane so as to be contactable by the membrane when deflected so as to limit the amount of deflection of the membrane, the MEMS transducer comprising a back-plate structure wherein the membrane layer is supported to be flexible with respect to said back-plate structure and the back-plate structure is on the opposite side of the membrane to the stop structure; wherein:
      the stop structure defines one or more openings to said one or more cavities and comprises at least one narrow support element within or between said one or more openings; and
      said at least one narrow support element forms a contact element positioned such that the membrane will make contact with the contact element if subject to a relatively large deflection towards the first surface.

2. A MEMS transducer as claimed in claim 1 wherein the total area of said one or more openings of the stop structure is greater than the total area of any openings in the back-plate structure.

* * * * *